United States Patent [19]

Wessely

[11] Patent Number: 4,517,624
[45] Date of Patent: May 14, 1985

[54] DEVICE FOR COOLING A PLURALITY OF INTEGRATED MODULES COMBINED ON A FLEXIBLE PRINTED CIRCUITBOARD TO FORM LOGIC CARDS

[75] Inventor: Herrmann Wessely, Munich, Fed. Rep. of Germany

[73] Assignee: Siemens Aktiengesellschaft, Berlin & Munich, Fed. Rep. of Germany

[21] Appl. No.: 526,370

[22] Filed: Aug. 25, 1983

[30] Foreign Application Priority Data

Sep. 9, 1982 [DE] Fed. Rep. of Germany ....... 3233522

[51] Int. Cl.³ .............................................. H05K 7/20
[52] U.S. Cl. ..................... 361/387; 361/398
[58] Field of Search ...................... 165/46, 80 B, 80 C, 165/185; 174/52 FP; 357/81, 79; 361/385–388, 398, 405

[56] References Cited

U.S. PATENT DOCUMENTS

| | | | |
|---|---|---|---|
| 3,896,544 | 7/1975 | Fosnough | 357/79 |
| 3,993,123 | 11/1976 | Chu et al. | 165/80 |
| 4,104,728 | 8/1978 | Kasubuchi | 361/398 |
| 4,180,828 | 12/1979 | Schermer et al. | 357/79 |
| 4,358,785 | 11/1982 | Takigami et al. | 357/79 |

FOREIGN PATENT DOCUMENTS 0001153  3/1979  European Pat. Off. .

OTHER PUBLICATIONS

Arnold, "IBM Technical Disclosure Bulletin", vol. 21, No. 4, 9/78, pp. 1473–1474.
Doo et al., "IBM Technical Disclosure Bulletin", vol. 21, No. 2, 7/79, pp. 585–586.
Wanesky, "Western Electric Technical Digest", No. 18, 4/70, pp. 41–42.

Primary Examiner—A. D. Pellinen
Assistant Examiner—Gregory D. Thompson
Attorney, Agent, or Firm—Hill, Van Santen, Steadman & Simpson

[57] ABSTRACT

Integrated modules are disposed on a flexible printed circuitboard. The entire rear surface of each module is in contact with a common cooling plate and the individual contact pressure of the individual integrated modules against the cooling plate occurs by way of resilient elements respectively inserted between the printed circuitboard and the modules.

7 Claims, 2 Drawing Figures

DEVICE FOR COOLING A PLURALITY OF INTEGRATED MODULES COMBINED ON A FLEXIBLE PRINTED CIRCUITBOARD TO FORM LOGIC CARDS

CROSS REFERENCE TO RELATED APPLICATION

This application is related to an application Ser. No. 526,372 filed Aug. 25, 1983.

BACKGROUND OF THE INVENTION

1. Field of the Invention

The present invention relates to a cooling device for cooling integrated modules and, in particular, for cooling a plurality of integrated modules combined to form logic cards.

2. Description of the Prior Art

Increasing miniaturization of integrated modules to form very large scale integrated (VLSI) modules and, in conjunction therewith, the high packing density result in a high heat emission of logic cards which are equipped with a plurality of such integrated modules, which can easily lead to a transgression of the temperatures permissible for the integrated modules. Such logic cards must therefore be provided with one or more cooling members for their protection.

It is known to employ large-surface metal plates as cooling members for such logic cards, the metal plates emitting the waste heat of the integrated modules either to the air surrounding the modules or to hollow bodies traversed by liquid or gas. Known, therefore, for example, from U.S. Pat. No. 3,993,123 is a device having a plurality of heat-generating electrical modules which are mounted on a base. A heat dissipation housing seals and surrounds the heat-generated components. The wall of the housing lying opposite the base exhibits elongate, cylindrical openings in the direction towards the heat-generating components. A spring element which is supported against the inner end of the opening is located in each such opening of the housing. Further location in each opening is a heat-conductive element in the form of a piston which is dimensioned such that only a narrow gap remains between the outer walls of the openings and the piston. Each spring element presses the heat conduction element against one of the heat-generating components. A thermally conductive, inert fluid is located inside of the housing and fills all gaps and cavities thereof. The heat is dissipated from the housing by external dissipation structure. Every individual electronic module is individually cooled by such measures or by techniques such as known from the European patent application No. 0001 153 as a further development of this general concept. Disadvantageous, given this type of cooling structure, however, is that heat from the chip of the integrated module flows only over punctiform contacts into the die and, from there into the actual cooling member over a gas path. The punctiform contact between the integrated module and the metal die and the gas path between the metal die and the cooling member have a relatively high thermal resistance. The structure, moreover, requires a high expense.

SUMMARY OF THE INVENTION

It is therefore the object of the present invention to provide a device for cooling such integrated modules which, on the one hand, exhibits significantly lower thermal resistance and, therefore, produces a noticeably better cooling of the integrated modules and which, moreover, requires significantly less expense.

The above object is achieved according to the present invention in that the integrated modules exhibit no housing; in that they are disposed on a flexible printed circuitboard; and in that the entire rear surface of each integrated module is in contact with the cooling plate exhibiting high planarity which is shared by all integrated modules. The thermal resistance of the device can be further reduced by inserting a conductive lubricant or grease between the integrated modules, on the one hand, and the cooling plate, on the other hand.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
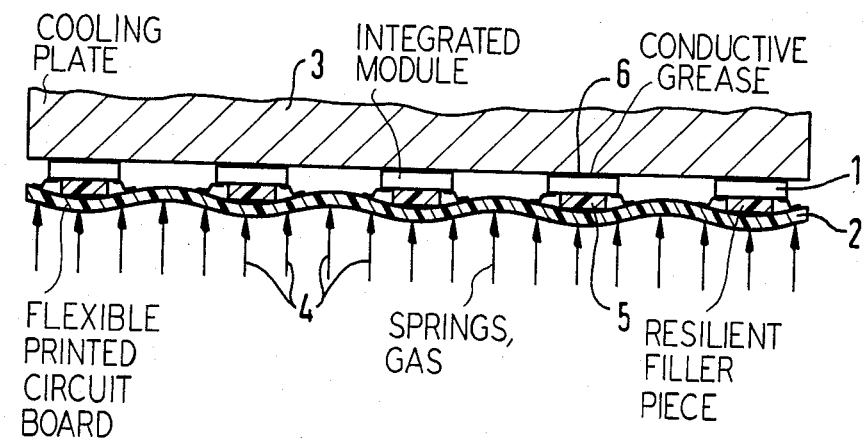
FIG. 1 is a schematic sectional view of a cooling device constructed in accordance with the present invention.

FIG. 1 illustrates a plurality of integrated modules 1 which are combined on a flexible printed circuitboard 2 to form a logic card. It can be further seen that the integrated modules 1, which are without housings, are in contact over their entire rear surfaces with a cooling plate 3 which is shared by all of the integrated modules. The common cooling plate 3 exhibits a very high planarity. The flexible printed circuitboard 2, together with the integrated modules 1, is pressed against the shared cooling plate 3 by way of a planarly effective contact pressure 4 in the form of, for example, a multitude of springs or a gaseous agent. Although a flexible printed circuitboard 2 already permits a rather good contact pressure of the individual integrated modules, the individual integrated modules 1 are also individually pressed against the common-cooling plate 3 in order to intensify this effect in that resilient elements 5 are respectively disposed between the flexible printed circuitboard 2 and the integrated module 1.

Figure 2:
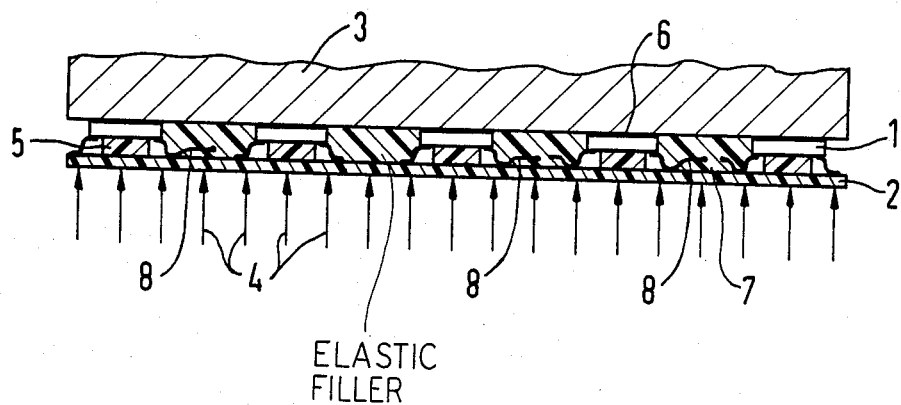
FIG 2 is a schematic sectional view illustrating the disposition of elastic filling material between the individual integrated modules.

FIGS. 1 and 2 illustrate an exemplary embodiment of such resilient elements, here in the form of a resilient filler piece 5 between an integrated module 1 and the printed circuitboard 2. The resilient filler piece 5 advantageously comprises rubber and the terminals of the individual modules 1 are designed such that they cannot absorb any forces. The resilient filler piece 5 cause the force 4, planarly exerted against the flexible printed circuitboard 2, be individually supplied to each individual integrated module and, therefore, each integrated module is reliably pressed against the shared cooling plate 3.

In order to further reduce the thermal resistance of the device of the present invention, which is already very low, it is advantageous to respectively insert conductive grease 6 between the integrated modules 1 and the common cooling plate 3.

Depending upon the flexibility of the flexible printed circuitboard and on the size of the surface load, the printed circuit is deformed to a lesser or greater degree, this potentially leading to damage to the circuit. In order to avoid this, the clearance between the flexible printed circuitboard 2 and the cooling plate 3 located in the environment of the integrated modules 1 is filled with elastic filler material 7 according to an advantageous further feature of the invention. Silicon, for example, can be provided as elastic filler material, the clearances being cast out therewith. However, in order to be able to disassemble the overall device at any time, it can be advantageous to lend the elastic filler material the shape of templates which are inserted between the integrated modules 1. The filling of the clearances in the environment of the integrated modules 1 causes the flexible printed circuitboard 2 to be relieved between the individual integrated modules. Further, the elastic filler material provides that discrete electrical connections 8, potentially located between the integrated modules 1, are mechanically supported and are likewise protected against damage.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A device which cools a plurality of integrated modules, comprising:
    a plurality of integrated modules each including a rear surface;
    a flexible printed circuitboard supporting said plurality of integrated modules;
    a common cooling plate including a highly planar surface engaging said rear surfaces;
    common pressure means acting on said flexible printed circuitboard to press the circuitboard and said modules toward said common cooling plate; and
    a plurality of individual pressure means each interposed between a respective module and said flexible printed circuitboard and pressing the respective module towards and into contact with said common cooling plate.

2. The device of claim 1, wherein: each of said individual pressure means comprises a resilient pad.

3. The device of claim 1, wherein: each of said individual pressure means comprises a rubber pad.

4. The device of claim 1, and further comprising:
    conductive grease between said modules and said common cooling plate.

5. The device of claim 1, and further comprising:
    an elastic filler disposed between said modules, said cooling plate and said printed circuitboard.

6. The device of claim 5, wherein:
said elastic filler comprises silicon.

7. The device of claim 5, wherein:
said elastic filler comprises an elastic template.

* * * * *